United States Patent
Sheu et al.

(10) Patent No.: US 7,982,308 B2
(45) Date of Patent: Jul. 19, 2011

(54) LIGHT-EMITTING DIODE PACKAGING STRUCTURE AND LIGHT-EMITTING DIODE MODULE

(75) Inventors: Sheng-Jia Sheu, Banciao (TW); Chien-Chang Pei, Linkou Township, Taipei County (TW)

(73) Assignee: Everlight Electronics Co., Ltd., Tu Chen, Taipei Hsien (TW)

( * ) Notice: Subject to any disclaimer, the term of this patent is extended or adjusted under 35 U.S.C. 154(b) by 502 days.

(21) Appl. No.: 12/076,487

(22) Filed: Mar. 19, 2008

(65) Prior Publication Data

US 2009/0166661 A1    Jul. 2, 2009

(30) Foreign Application Priority Data

Dec. 31, 2007    (TW) ................. 96222647 U

(51) Int. Cl.
*H01L 23/34* (2006.01)
(52) U.S. Cl. ........ 257/727; 257/688; 257/726; 257/785; 257/E33.062; 174/555; 439/358
(58) Field of Classification Search ............... 257/99, 257/666, 688, 692, 726, 727, 785, E23.078, 257/E33.062, E33.066, E33.071; 439/357, 358, 555, 863, 877, 878, 55; 174/545, 555, 561, 562, 563

See application file for complete search history.

(56) References Cited

U.S. PATENT DOCUMENTS

| | | | |
|---|---|---|---|
| 6,335,548 B1* | 1/2002 | Roberts et al. | 257/98 |
| 7,070,418 B1* | 7/2006 | Wang | 439/56 |
| 2008/0224166 A1* | 9/2008 | Glovatsky et al. | 257/99 |

* cited by examiner

*Primary Examiner* — Evan Pert
*Assistant Examiner* — Eduardo A Rodela
(74) *Attorney, Agent, or Firm* — Thomas, Kayden, Horstemeyer & Risley, LLP

(57) ABSTRACT

A light-emitting diode packaging structure, a packaging module and the assembling method thereof are disclosed. The assembling method comprises the steps of: providing a light-emitting diode, wherein the light-emitting diode has two electrode leads; providing two metal plates, wherein each of the metal plates has at least a clamping portion; holding the electrode leads against the metal plates respectively; and bending the clamping portion of each of the metal plates to fix the electrode leads on the metal plates. Further, a plurality of light-emitting diodes are allowed to be mounted on the metal plates to form the light-emitting diode packaging module.

8 Claims, 11 Drawing Sheets

LIGHT-EMITTING DIODE PACKAGING STRUCTURE AND LIGHT-EMITTING DIODE MODULE

RELATED APPLICATIONS

This application claims priority to Taiwan Application Serial Number 96222647, filed Dec. 31, 2007, which is herein incorporated by reference.

FIELD OF THE INVENTION

This invention relates to a light-emitting diode packaging structure, a packaging module and the assembling method thereof, and more particularly, to a light-emitting diode packaging structure, a packaging module and the assembling method for assembling at least one light-emitting diode without using welding.

BACKGROUND OF THE INVENTION

A light emitting diode (LED) has a low working voltage, low power loss, high light emitting efficiency, short response time, pure light color, solid structure, high impact resistance, high vibration endurance, stable performance, light weight, small volume and low cost. The promotion of the technology has helped to increase the brightness of the LED, and LEDs are being used in increasingly diverse applications such as large-scale display screens, status indication, symbol lighting, signal displays, backlight of a liquid crystal display (LCD) and lighting in car.

Conventional LEDs may be bonded on a metal substrate for circuit connection. When bonding the LED, the LED leads may be welded to the metal substrate. However, the temperature of the LED is too high during welding, and the LED chip may be burned out. Further, when the LED is welded to the metal substrate, it is difficult that the LED positions to the metal substrate. Therefore, there are problems when the LED is welded on the metal substrate.

SUMMARY OF THE INVENTION

Therefore, an aspect of the present invention is to provide a light-emitting diode packaging structure, a packaging module and the assembling method thereof to assemble the LED on the metal plates without using welding.

Another aspect of the present invention is to provide a light-emitting diode packaging structure, a packaging module and the assembling method thereof to position the LED on the metal plates precisely.

According to an embodiment of the present invention, the light-emitting diode packaging structure comprises a light-emitting diode and two metal plates. The light-emitting diode includes two electrode leads. The metal plates are mounted to the electrode leads respectively in a one-to-one manner, wherein each of the metal plates includes at least one clamping portion to clamp and fix the electrode leads thereon.

According to another embodiment of the present invention, the method for assembling the light-emitting diode packaging structure comprises: providing a light-emitting diode, wherein the light-emitting diode includes two electrode leads; providing two metal plates, wherein each of the metal plates includes at least one clamping portion; holding the electrode leads on the metal plates respectively in a one-to-one manner; and bending the clamping portion to clamp and fix the electrode leads on the metal plates respectively.

According to another embodiment of the present invention, the light-emitting diode packaging module comprises a plurality of light-emitting diodes and two metal plates. Each of the light-emitting diodes includes two electrode leads. The metal plates are mounted to the electrode leads respectively, wherein each of the metal plates includes a plurality of clamping portions to clamp and fix the electrode leads of the light-emitting diodes thereon.

According to another embodiment of the present invention, the method for assembling a light-emitting diode packaging module comprises: providing a plurality of light-emitting diode, wherein each of the light-emitting diodes includes two electrode leads; providing two metal plates, wherein each of the metal plates includes a plurality of clamping portions; holding the electrode leads on the metal plates respectively; and bending the clamping portions to clamp and fix the electrode leads on the metal plates respectively.

Therefore, with the application of the light-emitting diode packaging structure, the packaging module and the assembling method thereof of the present invention, the LED can be mounted and positioned on the metal plates without being welded. Therefore, the bonding between the electrode leads and the metal plates can be released, thereby preventing damage to the LED.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

In order to make the illustration of the present invention more explicit and complete, the following description is stated with reference to FIG. 1 through FIG. 6.

Figure 1A:
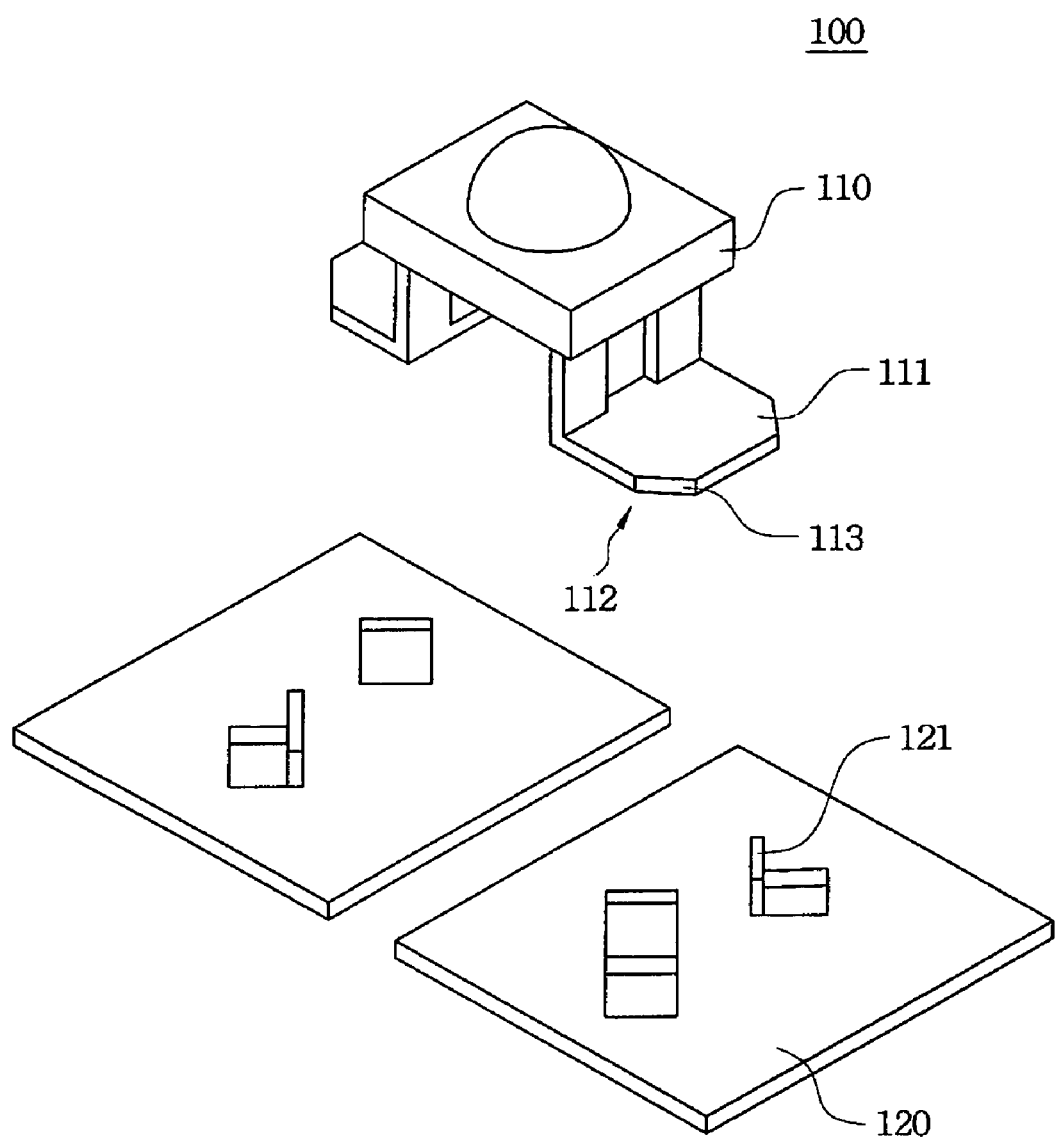
FIG. 1A to FIG. 1C are three-dimensional views showing a light-emitting diode packaging structure according to a first embodiment of the present invention.
Figure 1B:
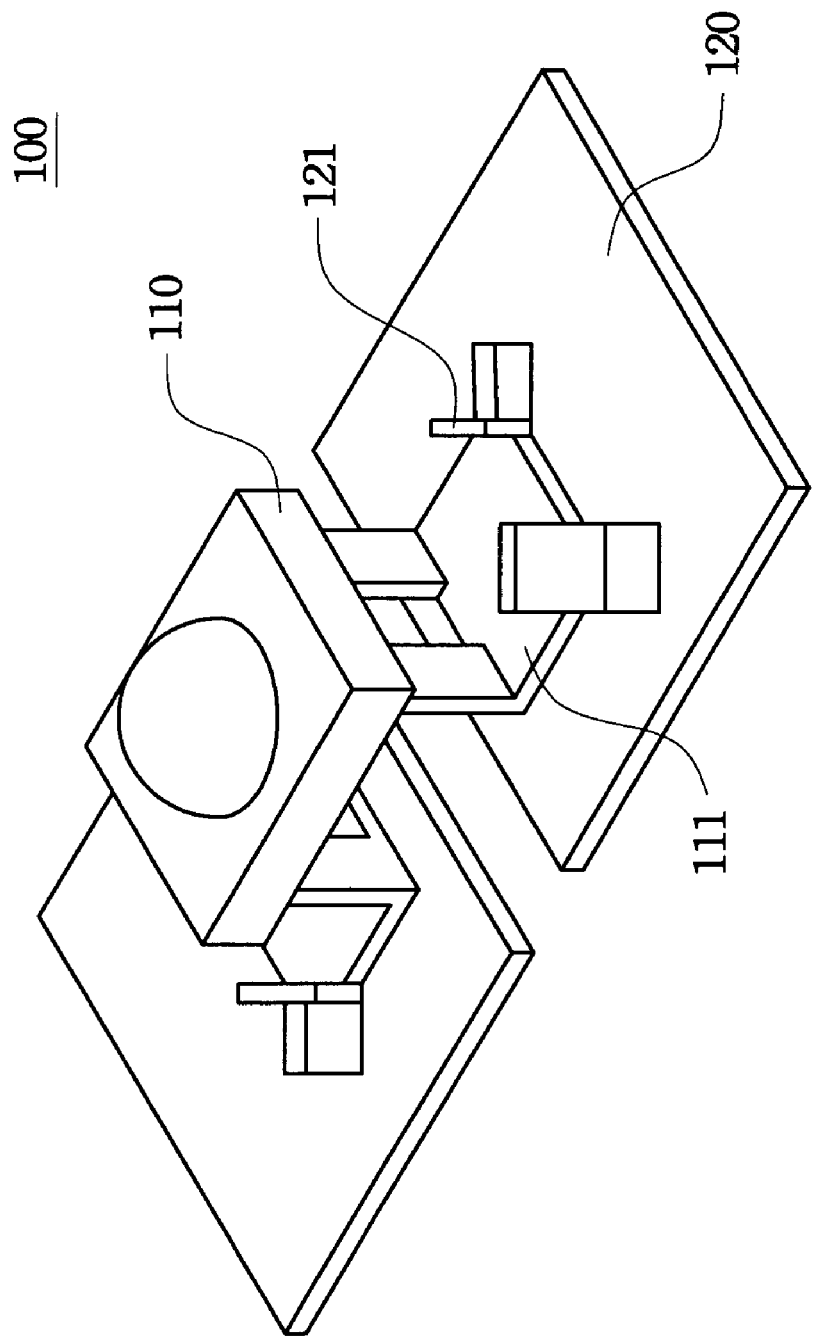
Figure 1C:
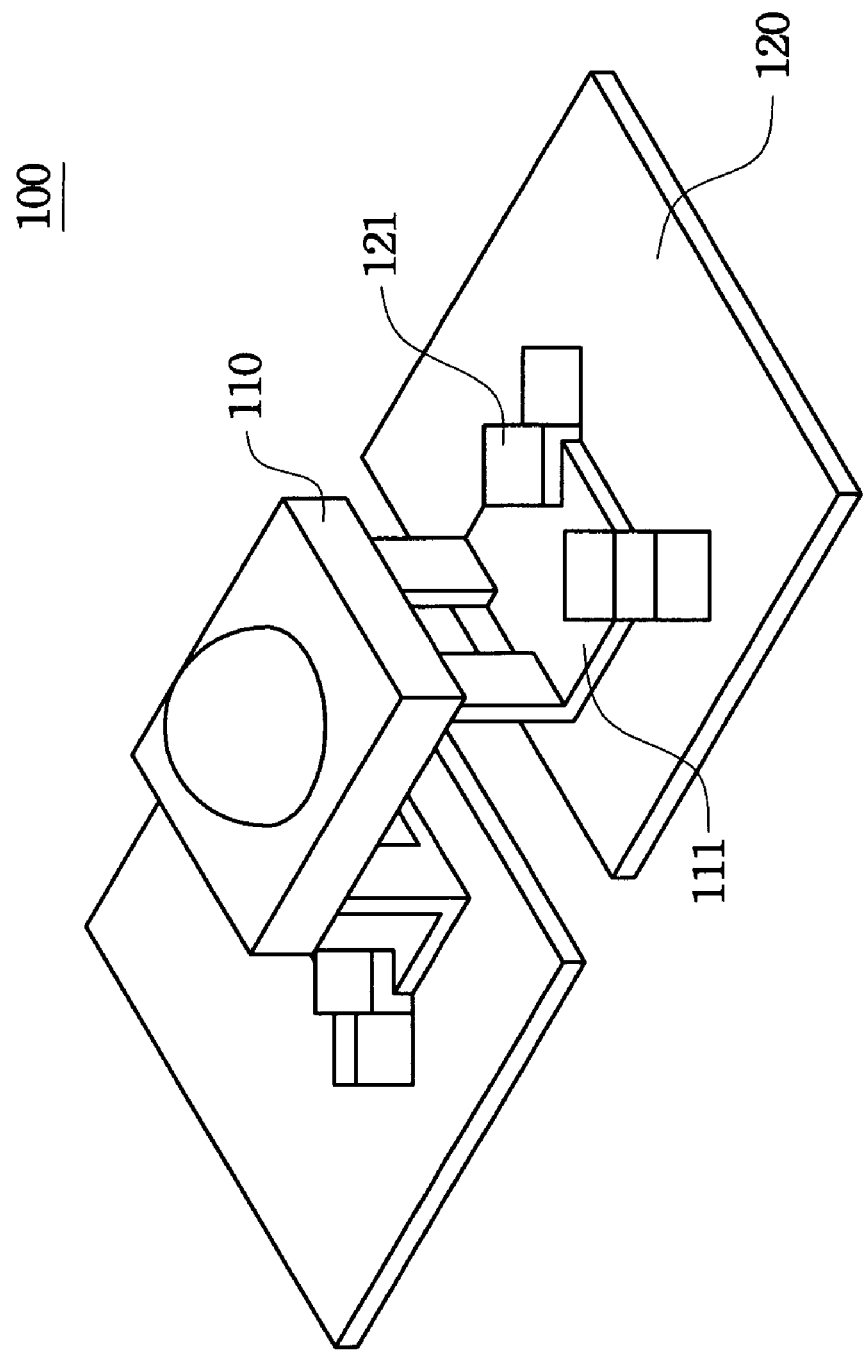

Refer to FIG. 1A, FIG. 1B and FIG. 1C. FIG. 1A, FIG. 1B and FIG. 1C are three-dimensional views showing a light-emitting diode packaging structure according to a first embodiment of the present invention. The light-emitting diode packaging structure 100 comprises a light-emitting diode (LED) 110 and two metal plates 120. The LED 110 is mounted on the metal plates 120 for electrical connection or heat dissipation.

Refer to FIG. 1A, FIG. 1B and FIG. 1C again. The LED 110 of the present embodiment includes two electrode leads 111 mounted on the metal plates 120 respectively in a one-to-one manner. Each of the electrode leads 111 is made of metal material, such as Al, Cu or Fe. The metal material preferably has great heat conduction. Each of the electrode leads 111 has a bonding surface 112 to be bonded on the metal plates 120. The metal plates 120 of the present embodiment are mounted to the electrode leads 111 respectively in a one-to-one manner for electrical connection or heat dissipation. Each of the metal plates 120 includes at least one clamping portion 121 to clamp and fix the electrode leads 111 thereon. Therefore, the electrode leads 111 of the LED 110 are mounted on the metal plates 120, thereby forming the light-emitting diode packaging structure 100. The clamping portion 121 of each of the metal plates 120 is positioned to the electrode leads 111. Therefore, the electrode leads 111 of the LED 110 can be positioned on the metal plates 120 by the clamping portion 121. The clamping portion 121 of each of the metal plates 120 may be formed as one piece together with the metal plates 120. For example, the clamping portion 121 may be formed on each of the metal plates 120 by a method of punching. The clamping portion 121 is bent from the outside to the inside of each of the electrode leads 111, thereby clamping the electrode leads 111 of the LED 110 on the metal plates 120 respectively. Therefore, the LED 110' can be bonded on the metal plates 120 firmly without using welding.

It is worth mentioning that an electrically conductive bonding material (such as an electrically conductive glue or a Ag glue) is allowed to be formed between each of the electrode leads 111 of the LED 110 and each of the metal plates 120 to enhance the bonding effect.

In the present embodiment, each of the electrode leads 111 has two contact surfaces 113 formed on the outer edge thereof, and each of the metal plates 120 may include two clamping portions 121 to contact the contact surfaces 113 respectively. At this time, the bonding surface 112 of each of the electrode leads 111 touches each of the metal plates 120, and the contact surfaces 113 touch the clamping portions 121. Therefore, each of the electrode leads 111 can be held and positioned by the clamping portions 121 of the metal plates 120. Further, there is preferably a angle (such as 90 degrees) formed between the clamping portions 121 of the metal plates 120 of the present embodiment, thereby making it easier to position each of the electrode leads 111 thereon.

Refer to FIG. 1A, FIG. 1B and FIG. 1C again. When assembling the light-emitting diode packaging structure 100, the electrode leads 111 are held on the metal plates 120 respectively in a one-to-one manner. At this time, the clamping portion 121 of the metal plates 120 can hold and position the electrode leads 111. Next, at least one clamping portion 121 is bent to clamp and fix the electrode leads 111 on the metal plates 120 respectively, thereby resulting in the LED packaging structure 100.

Therefore, the light-emitting diode packaging structure 100 of the present embodiment can be achieved without welding, and the assembling method thereof is simple, thereby enhancing the manufacturing yield. Further, the clamping portion 121 can position the LED 110, thereby raising the positioning accuracy and assembling efficiency.

Figure 2:
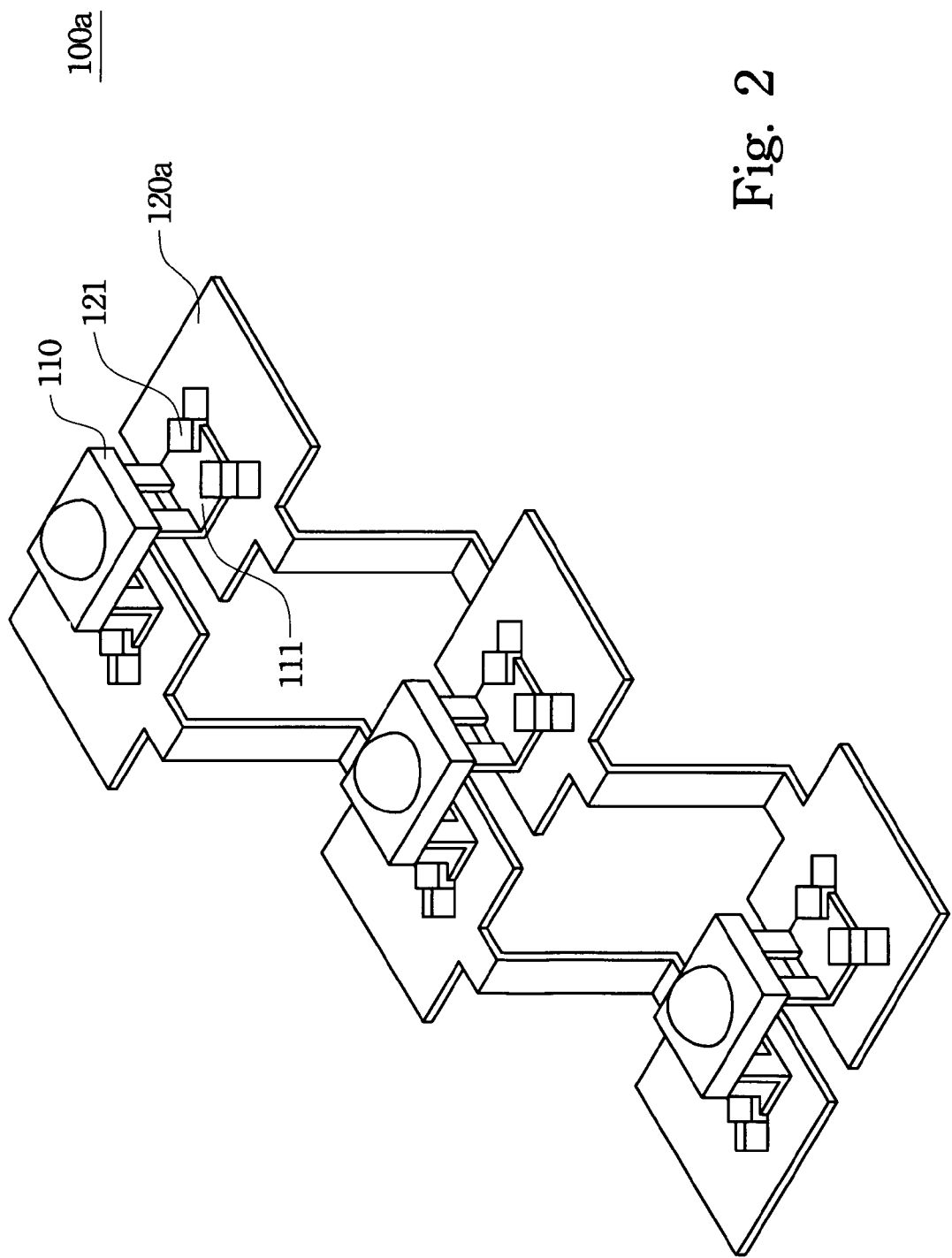
FIG. 2 is a three-dimensional view showing a light-emitting diode packaging module according to a second embodiment of the present invention.

Refer to FIG. 2. FIG. 2 is a three-dimensional view showing a light-emitting diode packaging module according to a second embodiment of the present invention. Some reference numerals shown in the first embodiment are used in the second embodiment of the present invention. The construction of the second embodiment is similar to that in the first embodiment with respect to configuration and function, and thus is not stated in detail herein.

Refer again to FIG. 2, in comparison with the first embodiment, a plurality of LEDs 110 of the second embodiment are mounted on the two metal plates 120a, thereby forming a light-emitting diode packaging module 100a. At this time, each of the metal plates 120a includes a plurality of clamping portions 121 to clamp and fix the electrode leads 111 of the LEDs 110 thereon. Further, the metal plates 120a are allowed to bend to form a predetermined three-dimensional structure according to the actual requirement when using the light-emitting diode packaging module 100a of the second embodiment.

Figure 3A:
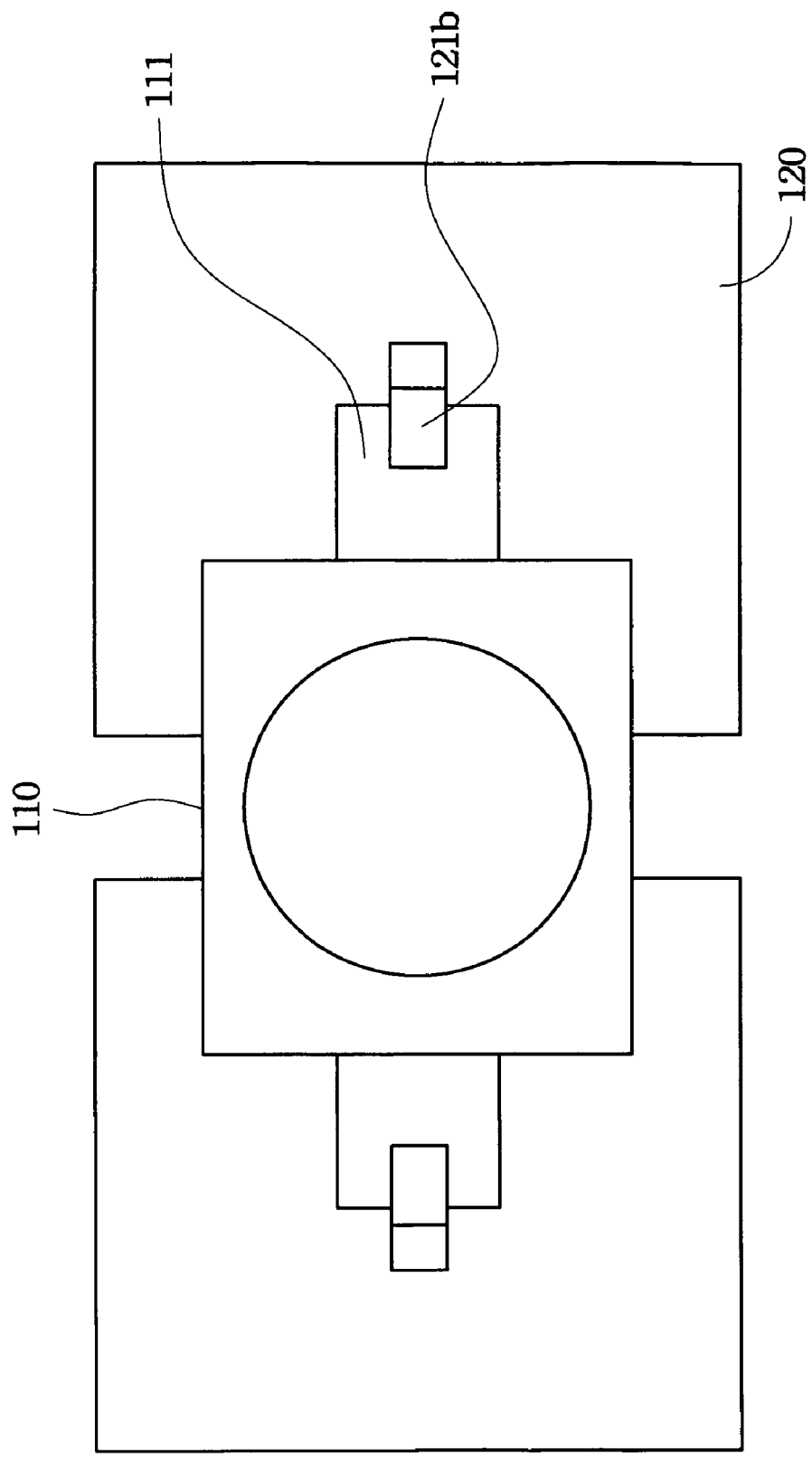
FIG. 3A is a top view showing a light-emitting diode packaging structure according to a third embodiment of the present invention.
Figure 3B:
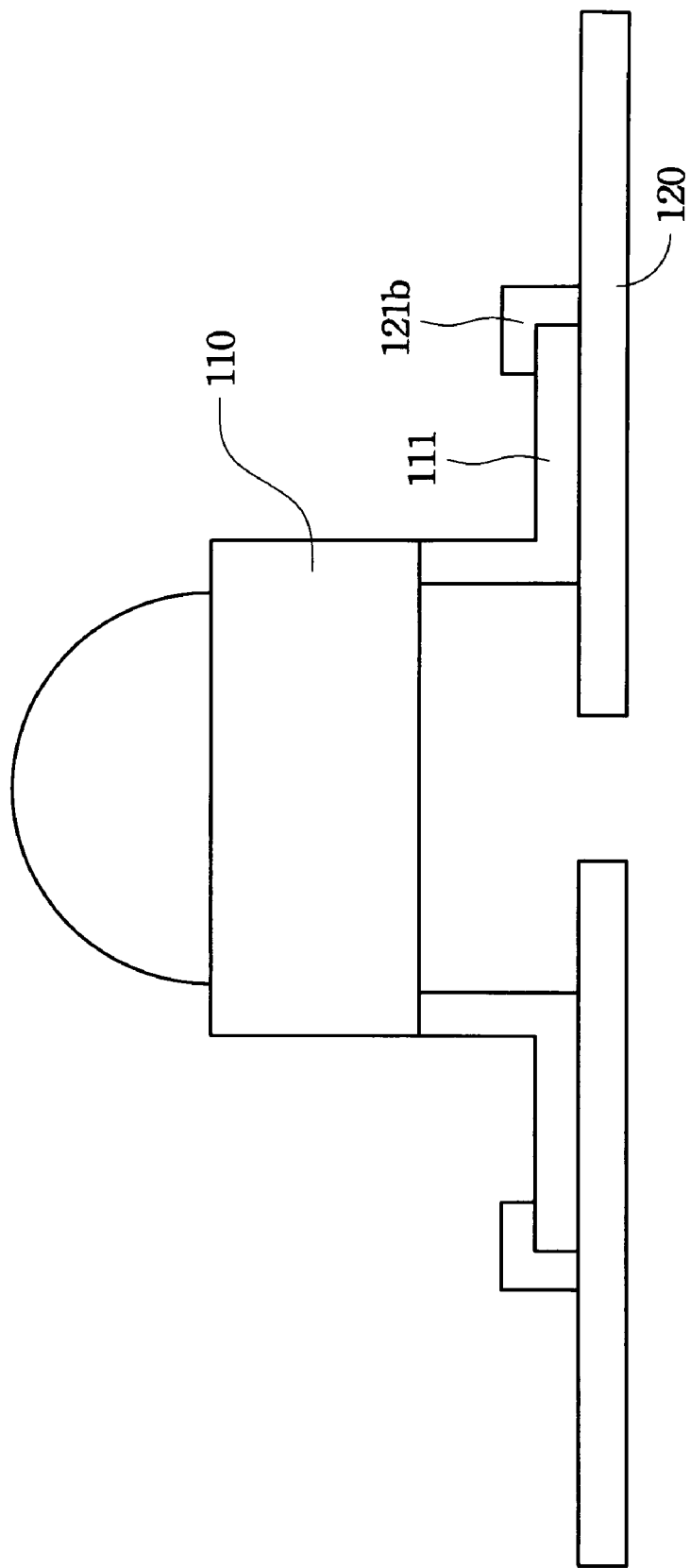
FIG. 3B is a side view showing a light-emitting diode packaging structure according to a third embodiment of the present invention.

Refer to FIG. 3A and FIG. 3B. FIG. 3A is a top view showing a light-emitting diode packaging structure according to a third embodiment of the present invention. FIG. 3B is a side view showing a light-emitting diode packaging structure according to a third embodiment of the present invention. Some reference numerals shown in the first embodiment are used in the third embodiment of the present invention. The construction of the third embodiment is similar to that in the first embodiment with respect to configuration and function, and thus is not stated in detail herein.

Refer again to FIG. 3A and FIG. 3B, in comparison with the first embodiment, each of the metal plates 120 includes a clamping portion 121b to clamp and fix the electrode leads 111 thereon. Therefore, the light-emitting diode packaging structure 100 can be achieved without welding, thereby raising the assembling efficiency.

Figure 4:
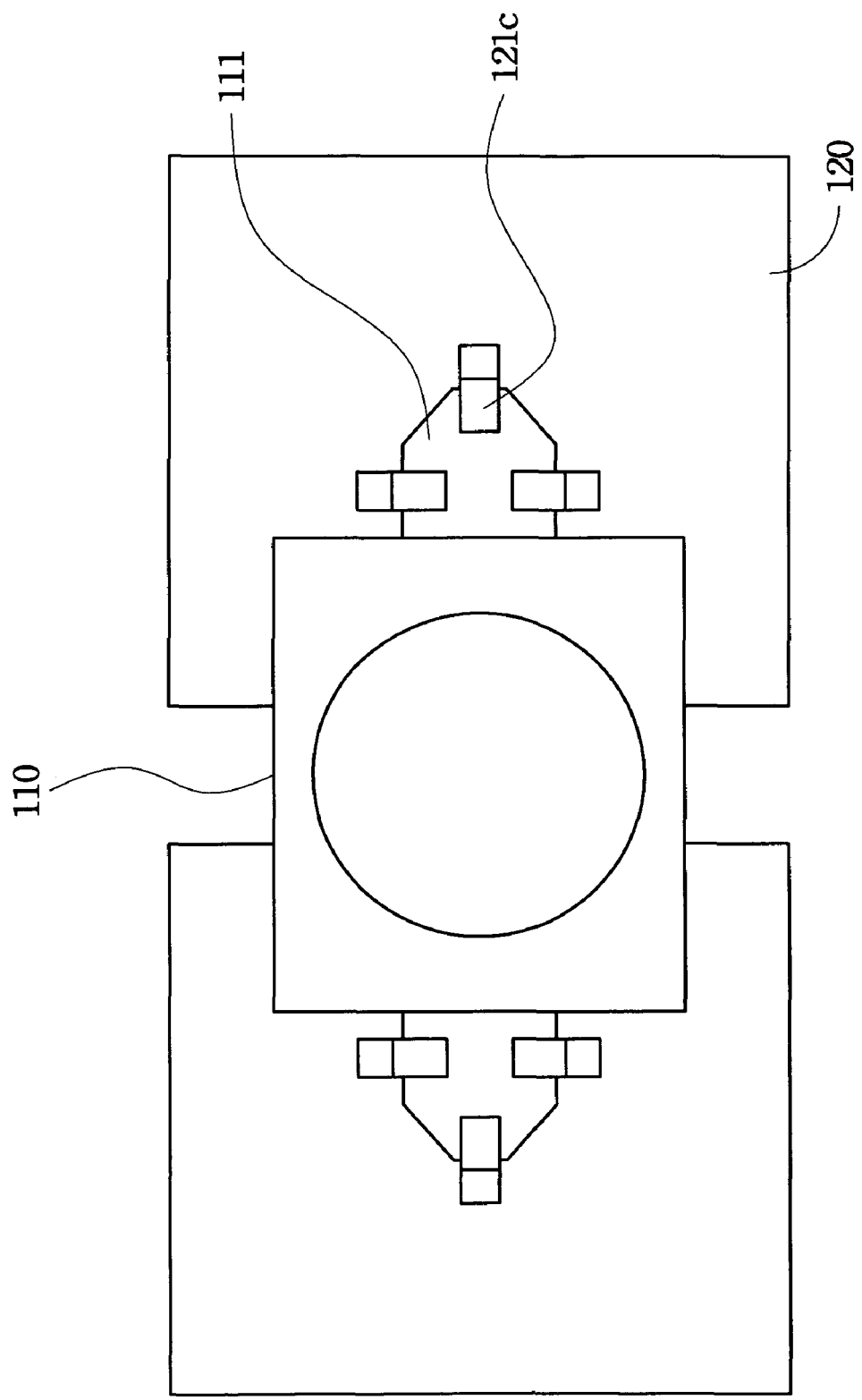
FIG. 4 is a top view showing a light-emitting diode packaging structure according to a fourth embodiment of the present invention.

Refer to FIG. 4. FIG. 4 is a top view showing a light-emitting diode packaging structure according to a fourth embodiment of the present invention. Some reference numerals shown in the first embodiment are used in the fourth embodiment of the present invention. The construction of the fourth embodiment is similar to that in the first embodiment with respect to configuration and function, and thus is not stated in detail herein.

Refer again to FIG. 4, in comparison with the first embodiment, each of the metal plates 120 of the fourth embodiment includes three clamping portion 121c to clamp and fix the electrode leads 111 thereon. Therefore, the electrode leads 111 of the LED 110 can be held on the metal plates 120 firmly, thereby raising the bonding stability and positioning accuracy.

Figure 5A:
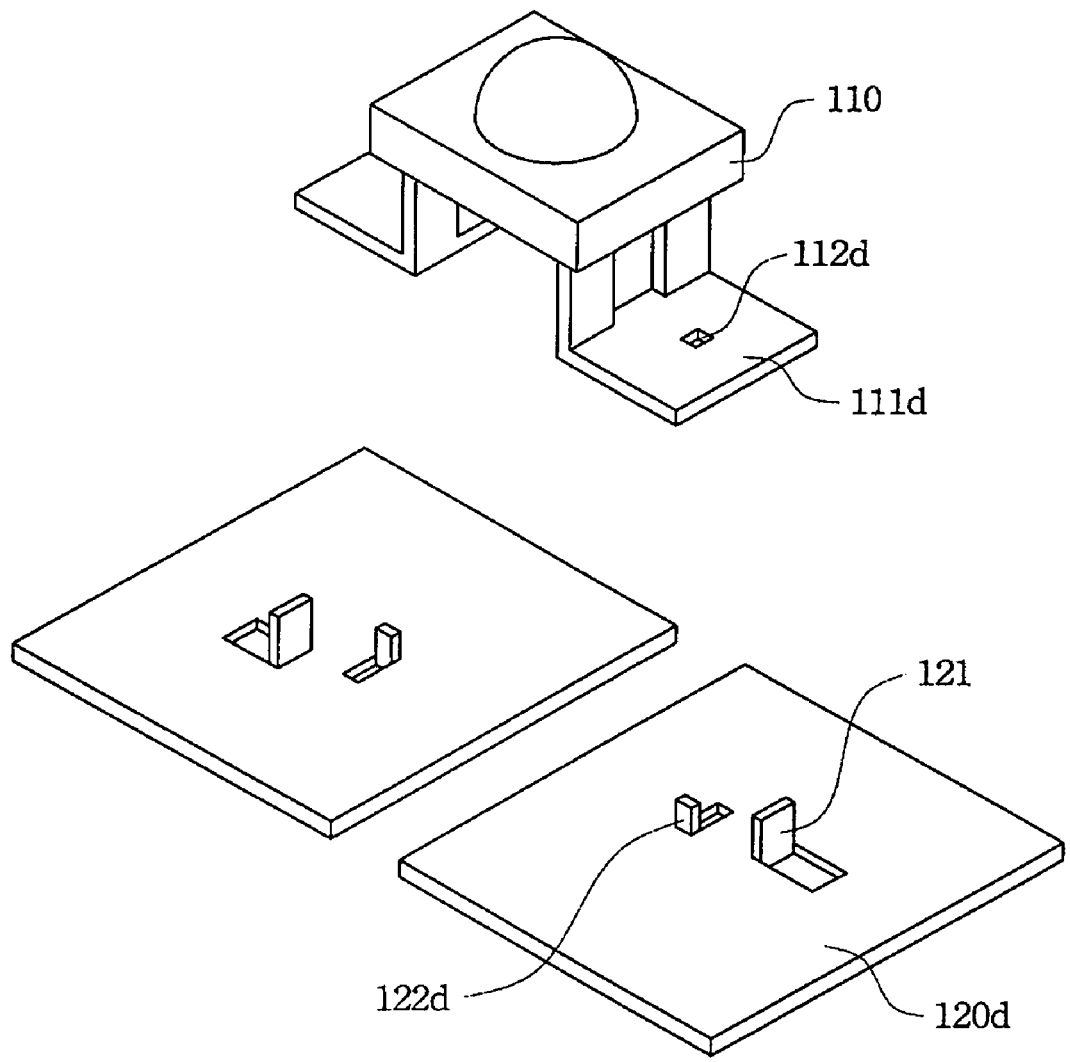
FIG. 5A to FIG. 5C are three-dimensional views showing a light-emitting diode packaging structure according to a fifth embodiment of the present invention.
Figure 5B:
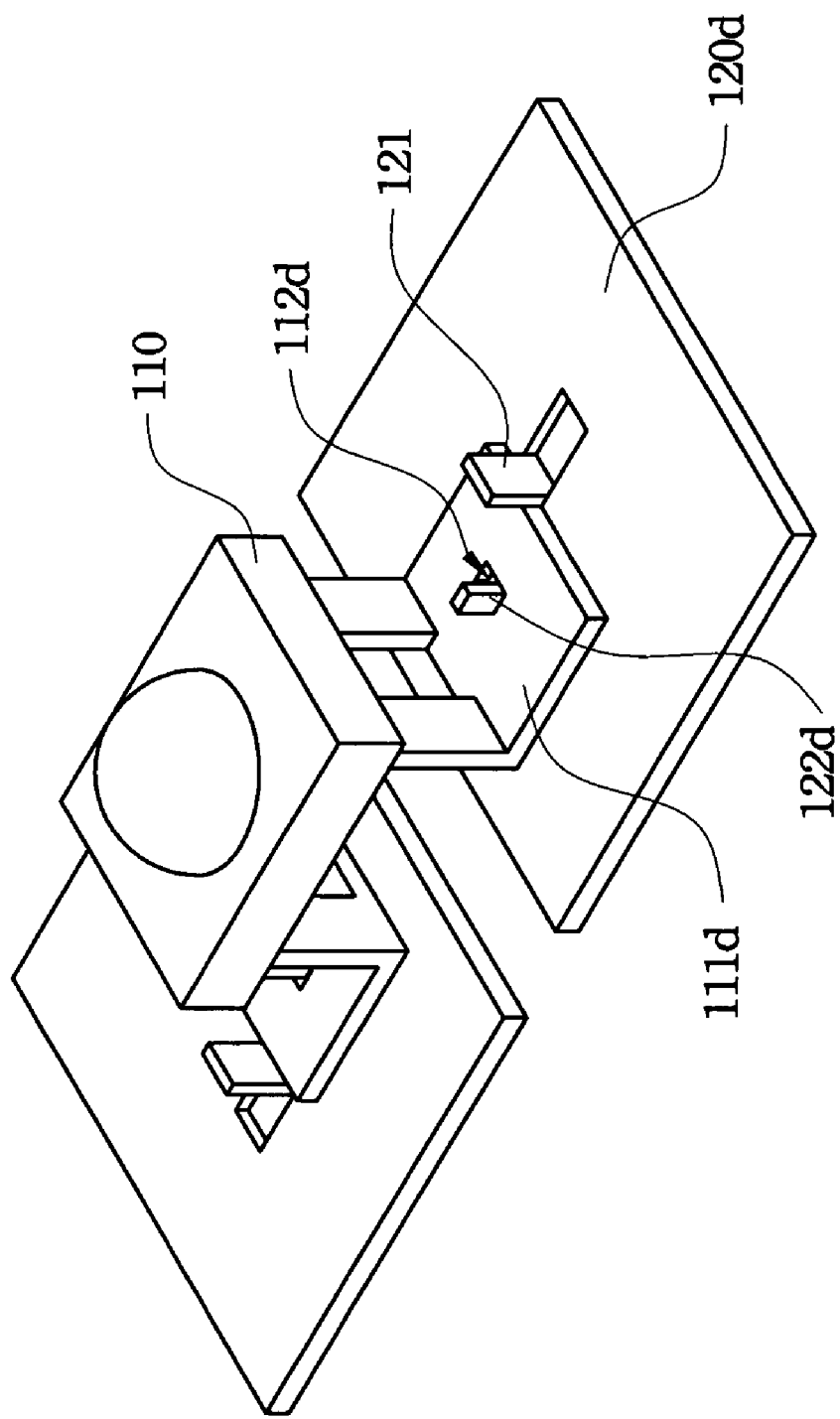
Figure 5C:
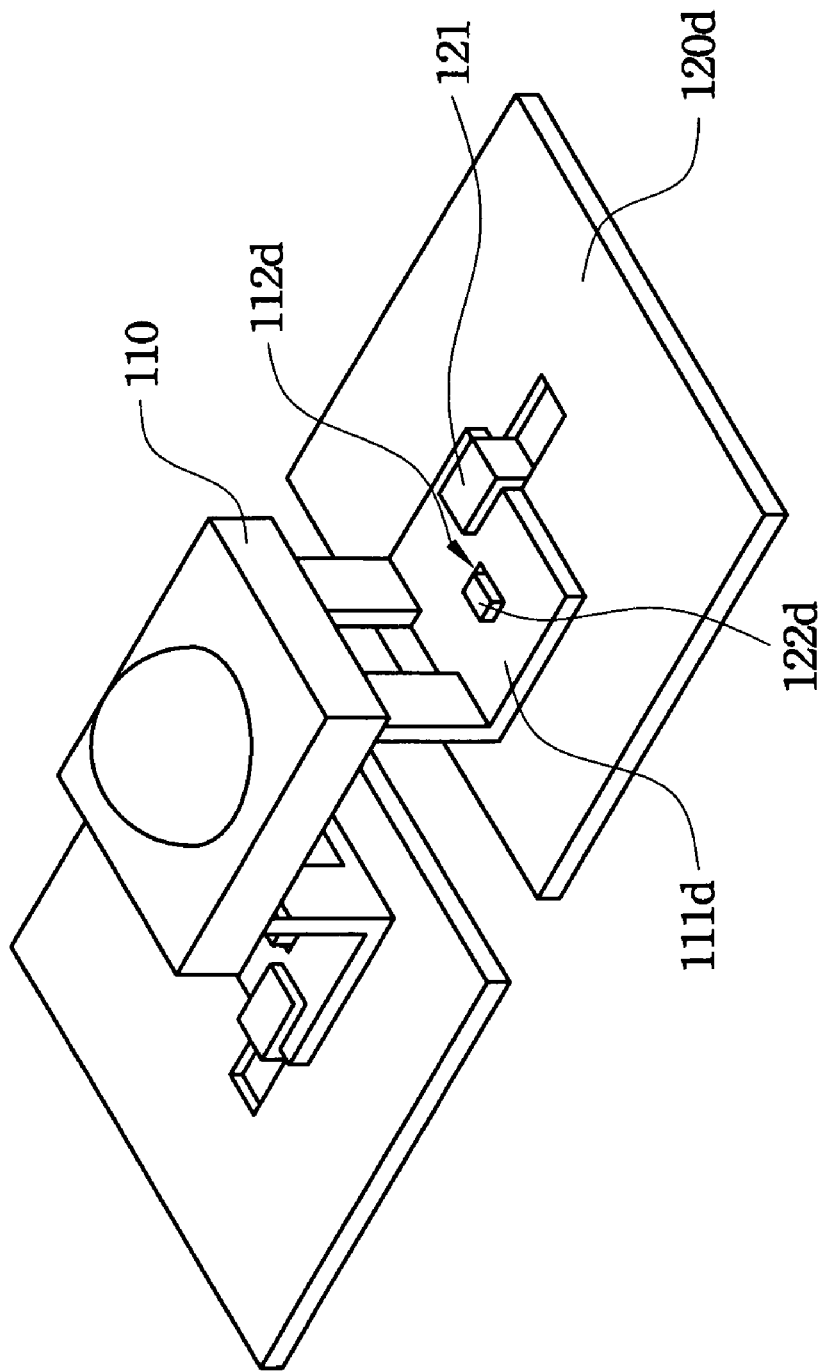

Refer to FIG. 5A, FIG. 5B and FIG. 5C. FIG. 5A, FIG. 5B and FIG. 5C are three-dimensional views showing a light-emitting diode packaging structure according to a fifth embodiment of the present invention. Some reference numerals shown in the first embodiment are used in the fifth embodiment of the present invention. The construction of the fifth embodiment is similar to that in the first embodiment with respect to configuration and function, and thus is not stated in detail herein.

Refer again to FIG. 5A, FIG. 5B and FIG. 5C, in comparison with the first embodiment, each of the electrode leads 111d of the LED 110 of the fifth embodiment at least one position hole 112d, and each of the metal plates 120d further includes at least one holding portion 122d corresponding to the position hole 112d for passing through the position hole 112d and holding the electrode leads 111d of the LED 110 thereon. The holding portion 122d of each of the metal plates 120 may be formed as one piece together with the metal plates 120. For example, the clamping portion 121 may be formed on each of the metal plates 120 by a punching method. The holding portion 122d and the clamping portion 121 of each of the metal plates 120 are bent to clamp and hold the electrode leads 111*d* of the LED 110 on the metal plates 120 respectively. Therefore, the LED 110 of the fifth embodiment can be bonded on the metal plates 120 firmly without using welding.

Figure 6:
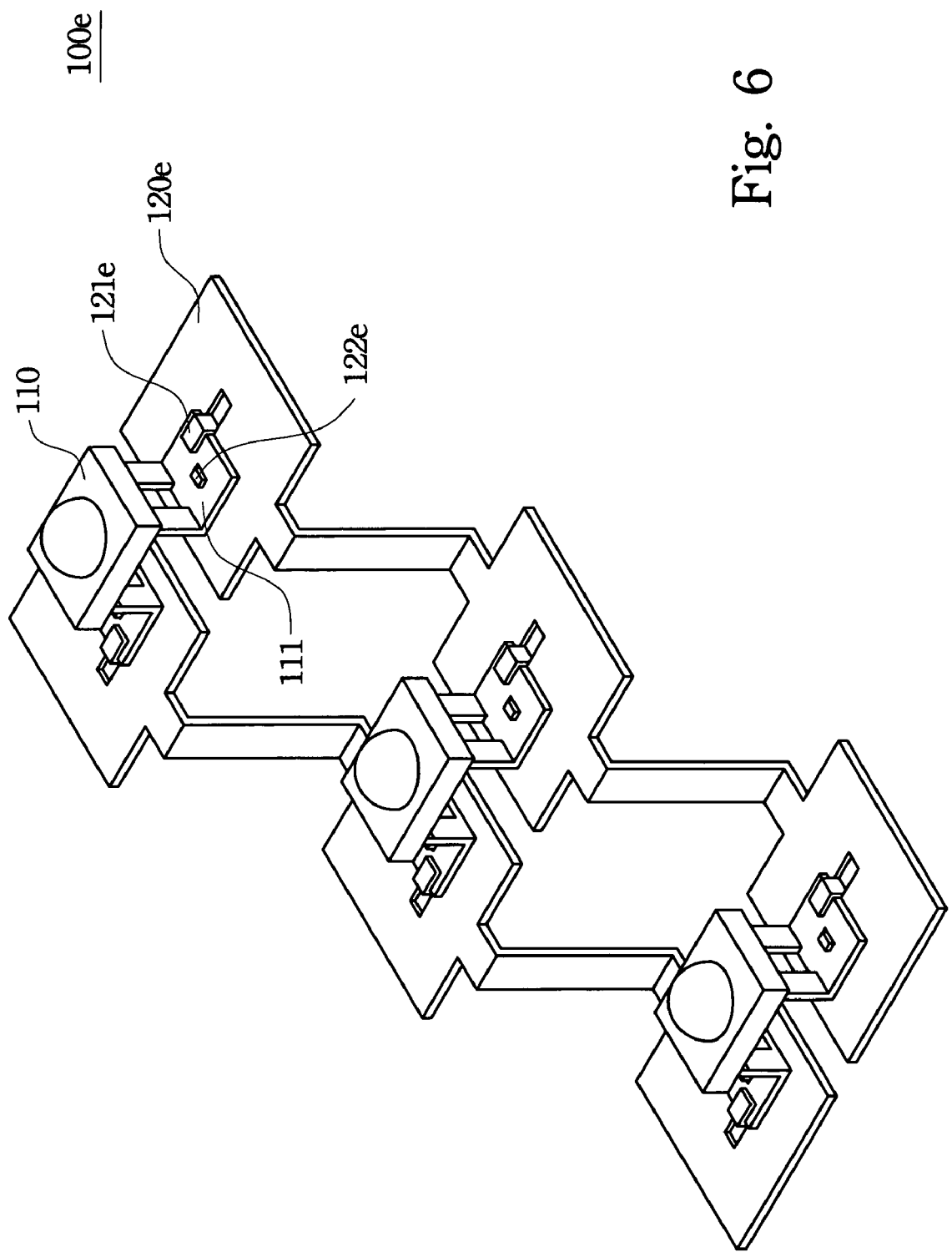
FIG. 6 is a three-dimensional view showing a light-emitting diode packaging module according to a sixth embodiment of the present invention.

Refer to FIG. 6. FIG. 6 is a three-dimensional view showing a light-emitting diode packaging module according to a sixth embodiment of the present invention. Some reference numerals shown in the fifth embodiment are used in the sixth embodiment of the present invention. The construction of the sixth embodiment is similar to that in the fifth embodiment with respect to configuration and function, and thus is not stated in detail herein.

Refer again to FIG. 6, in comparison with the fifth embodiment, a plurality of LEDs 110 may be mounted on the two metal plates 120*e* of the sixth embodiment, thereby forming a light-emitting diode packaging module, 100*e*. At this time, each of the metal plates 120*e* includes a plurality of clamping portion 121*e* and a plurality of holding portion 122*e* to clamp and hold the electrode leads 111 of the LEDs 110 thereon. Further, the metal plates 120*e* can be bent to form a predetermined three-dimensional structure according to the actual requirement when using the light-emitting diode packaging module 100*e* of the sixth embodiment.

Therefore, the LED can be mounted on the metal plates by the simple assembling method of the present invention without using welding. Further, during the assembling process, the electrode leads of the LED are mounted to the metal plates by mechanical method. Therefore, in comparison with the welding method, the bonding between the electrode leads and the metal plates can be released without damaging the LED, and the LED can be reused.

As is understood by a person skilled in the art, the foregoing embodiments of the present invention are strengths of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A light-emitting diode package structure comprising:
a light-emitting diode including two electrode leads; and
two metal plates mounted to the electrode leads respectively, wherein each of the metal plates includes at least one clamping portion to clamp and fix at least one of the electrode leads on the metal plate, the clamping portion is upwardly extending from the metal plate and horizontally bent on a top surface of the at least one of the electrode leads to clamp the at least one of the electrode leads on the metal plate, wherein each of the electrode leads includes at least one position hole, and each of the metal plates further includes at least one holding portion corresponding to the position hole for passing through the position hole and holding the electrode leads thereon.

2. The light-emitting diode package structure as claimed in claim 1, wherein the holding portion of each of the metal plates is formed as one piece together with the metal plates.

3. The light-emitting diode package structure as claimed in claim 2, wherein the holding portion of each of the metal plates is formed by a method of punching.

4. The light-emitting diode package structure as claimed in claim 1, wherein an electrically conductive bonding material is formed between each of the electrode leads and each of the metal plates.

5. The light-emitting diode package structure as claimed in claim 4, wherein the electrically conductive bonding material is an electrically conductive glue or an Ag glue.

6. A light-emitting diode module comprising:
a plurality of light-emitting diode packages, each of the light-emitting diode packages comprising
a plurality of light-emitting diodes, wherein each of the light-emitting diodes includes two electrode leads; and
a plurality of metal plates mounted to the electrode leads respectively, wherein each of the metal plates includes a plurality of clamping portions to clamp and fix the electrode leads of the light-emitting diodes on the metal plate, the clamping portions are upwardly extending from the metal plate and horizontally bent on top surfaces of the electrode leads to clamp the electrode leads on the metal plate, wherein each of the electrode leads includes at least one position hole, and each of the metal plates further includes at least one holding portion corresponding to the position hole of each of the electrode leads for passing through the position holes and holding the electrode leads thereon.

7. The light-emitting diode module as claimed in claim 6, wherein the holding portions of each of the metal plates are formed as one piece together with the metal plates.

8. The light-emitting diode module as claimed in claim 7, wherein the holding portions of each of the metal plates are formed by a method of punching.

* * * * *